(12) United States Patent
Chang et al.

(10) Patent No.: US 9,939,578 B2
(45) Date of Patent: Apr. 10, 2018

(54) LOW COST INTEGRATION OF OPTICAL COMPONENTS IN PLANAR LIGHTWAVE CIRCUITS

(71) Applicant: Intel Corporation, Santa Clara, CA (US)

(72) Inventors: Peter L. D. Chang, Portland, OR (US); Jai-Hung Tseng, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 854 days.

(21) Appl. No.: 13/891,543

(22) Filed: May 10, 2013

(65) Prior Publication Data

US 2014/0334768 A1    Nov. 13, 2014

(51) Int. Cl.
*G02B 6/12*   (2006.01)
*G02B 6/138*   (2006.01)
*G02B 6/42*   (2006.01)

(52) U.S. Cl.
CPC .............. *G02B 6/12* (2013.01); *G02B 6/138* (2013.01); *G02B 6/4204* (2013.01); *G02B 6/4212* (2013.01); *G02B 2006/12171* (2013.01); *H01L 2224/16225* (2013.01); *H01L 2224/48091* (2013.01); *H01L 2224/48227* (2013.01)

(58) Field of Classification Search
CPC .......... G02B 6/4204; G02B 6/12; G02B 6/14; G02B 6/12019; G02B 6/12152; G02B 6/4212
See application file for complete search history.

(56) References Cited

U.S. PATENT DOCUMENTS

| | | | | |
|---|---|---|---|---|
| 3,969,014 A | * | 7/1976 | Auracher | ............... G02B 6/262 |
| | | | | 385/31 |
| 5,332,690 A | * | 7/1994 | Cho | .......................... G02B 6/42 |
| | | | | 385/130 |
| 6,269,209 B1 | * | 7/2001 | Terada | ...................... G02B 6/42 |
| | | | | 174/256 |

(Continued)

FOREIGN PATENT DOCUMENTS

| | | | | |
|---|---|---|---|---|
| EP | 0689067 A2 | * | 12/1995 | ............. B82Y 20/00 |
| EP | 1835318 A1 | * | 9/2007 | ............... G02B 6/12 |

(Continued)

*Primary Examiner* — Michelle R Connelly
(74) *Attorney, Agent, or Firm* — Compass IP Law PC

(57) ABSTRACT

Planar lightwave circuits with a polymer coupling waveguide optically coupling a planar waveguide over a first region of a substrate to an optical component, such as a laser, affixed to a second region of the substrate. The coupling waveguide may be formed from a polymer layer applied over the planar waveguide and optical component such that any misalignment between the two may be accommodated by patterning the polymer into a waveguide having a first end aligned to an end of the planar waveguide and a second end aligned to an edge of the optical component. In embodiments, the polymer is photo-definable, such as a negative resist, and may be patterned through direct laser writing. In embodiments, the optical component is a thin film affixed to the substrate through micro-transfer printing. In other embodiments, the optical component is a semiconductor chip affixed to the substrate by flip-chip bonding.

14 Claims, 11 Drawing Sheets

(56) References Cited

U.S. PATENT DOCUMENTS

| | | | |
|---|---|---|---|
| 6,483,967 B2 * | 11/2002 | Tang | G02B 6/305 385/131 |
| 6,552,366 B1 * | 4/2003 | Terada | H01L 31/12 257/80 |
| 6,697,392 B2 * | 2/2004 | Ishino | G02B 6/305 372/22 |
| 7,933,480 B2 * | 4/2011 | Hirose | C03C 25/105 385/49 |
| 8,731,346 B2 | 5/2014 | Tseng et al. | |
| 8,798,409 B2 * | 8/2014 | Pardo | H04B 10/506 385/129 |
| 9,025,926 B2 | 5/2015 | Chang et al. | |
| 9,036,954 B2 | 5/2015 | Kobrinsky et al. | |
| 9,250,406 B2 | 2/2016 | Chang et al. | |
| 2002/0037143 A1 * | 3/2002 | Kuhara | G02B 6/29361 385/94 |
| 2002/0067892 A1 * | 6/2002 | Oguro | G02B 6/12004 385/49 |
| 2002/0118917 A1 * | 8/2002 | Kawai | G02B 6/42 385/31 |
| 2003/0198441 A1 * | 10/2003 | Goto | G02B 6/4246 385/49 |
| 2005/0207693 A1 * | 9/2005 | Yokouchi | G02B 6/138 385/14 |
| 2008/0044127 A1 * | 2/2008 | Leising | G02B 6/12004 385/14 |
| 2009/0169219 A1 * | 7/2009 | Nakano | G02B 6/43 398/200 |
| 2009/0304326 A1 * | 12/2009 | Blauvelt | G02B 6/132 385/14 |
| 2010/0142900 A1 * | 6/2010 | Uchida | G02B 6/4249 385/89 |
| 2014/0086527 A1 | 3/2014 | Ban et al. | |
| 2014/0177995 A1 | 6/2014 | Mohammed et al. | |

FOREIGN PATENT DOCUMENTS

| | | | |
|---|---|---|---|
| GB | 1482996 A | * | 8/1977 |
| JP | 2009237196 A | * | 10/2009 |
| WO | 2013/043183 A1 | | 3/2013 |
| WO | 2013/074103 A1 | | 5/2013 |
| WO | 2013/095426 A1 | | 6/2013 |
| WO | 2013/101112 A1 | | 7/2013 |
| WO | 2013/101184 A1 | | 7/2013 |
| WO | 2013/133794 A1 | | 9/2013 |

* cited by examiner

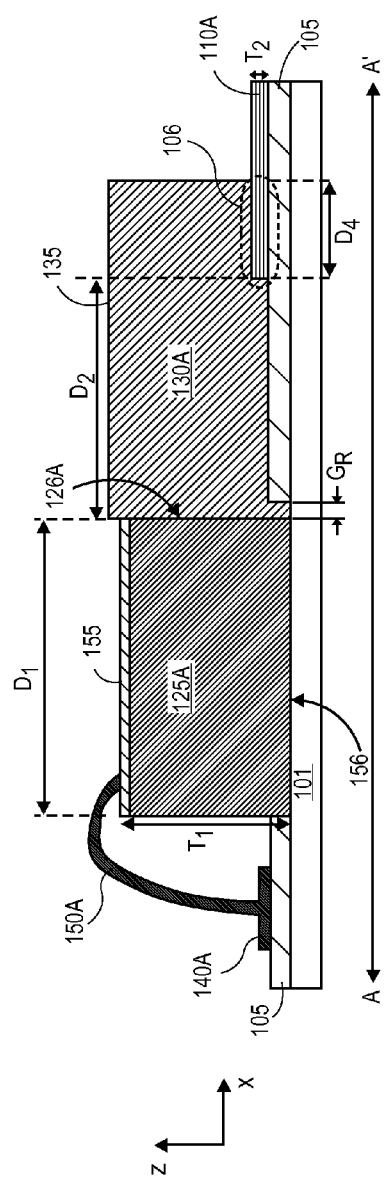
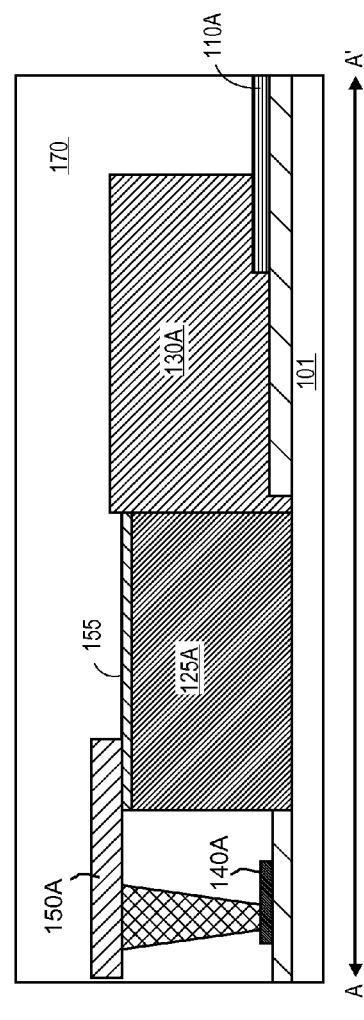

LOW COST INTEGRATION OF OPTICAL COMPONENTS IN PLANAR LIGHTWAVE CIRCUITS

TECHNICAL FIELD

Embodiments of the present invention generally relate to planar lightwave circuits (PLC), and more particularly relate to integrating electro-optically active components onto a substrate of the PLC.

BACKGROUND

Photonic circuits are useful as optical data links in applications such as, but not limited to, high performance computing (HPC), optical memory extension (OME), datacenters (DC), and device interconnects. For example, in mobile computing platforms a photonic IC (PIC) is a useful means of input/output (I/O) to rapidly update or sync a mobile device with a PLC device and/or cloud service where a wireless or electrical link has insufficient bandwidth. Such optical links utilize an optical I/O interface that includes an optical transmitter and an optical receiver.

PLCs entail an architecture in which at least the optical coupling of photonic components is provided, at least in part, by a planar substrate, such as a semiconductor wafer, that is fabricated in accordance with the many techniques employed in the manufacture of electrical integrated circuits (EICs).

In the current state of the art, a number of active electro-optical components, such as an emitting laser, and/or electro-absorption modulator (EAM) may be employed for an optical link. To date, these components remain relatively expensive as a function of their composition (e.g., employing III-V semiconductor substrates, complex epitaxial stacks, etc.), and further require precise alignment to the waveguide interconnecting them within the PLC. For example, where the lightwave circuit employs a single-mode planar waveguide, <1 µm (micron) accuracy is needed for sufficient optical coupling. Between the high average selling price of the active electro-optical components and the costs associated with active alignment equipment and performance of active alignment processes, high volume manufacturing of optical I/O links has yet to be attained. As a result, integration of such links into computing platforms remains prohibitively expensive.

Techniques and structures for integrating optical components onto a PLC substrate that reduce alignment costs and/or reduce component costs are therefore commercially advantageous.

BRIEF DESCRIPTION OF THE DRAWINGS

Embodiments of the present invention are illustrated by way of example, and not limitation, in the figures of the accompanying drawings in which:

FIG. 2A illustrates a cross-sectional view of the PLC in FIG. 1, where the optical component includes a semiconductor film non-native to the substrate and affixed directly to the substrate, in accordance with an embodiment;

FIG. 2B illustrates a cross-sectional view of the PLC in FIG. 1, where the optical component includes a semiconductor film non-native to the substrate and affixed directly to the substrate, in accordance with an embodiment;

DETAILED DESCRIPTION

Figure 1:
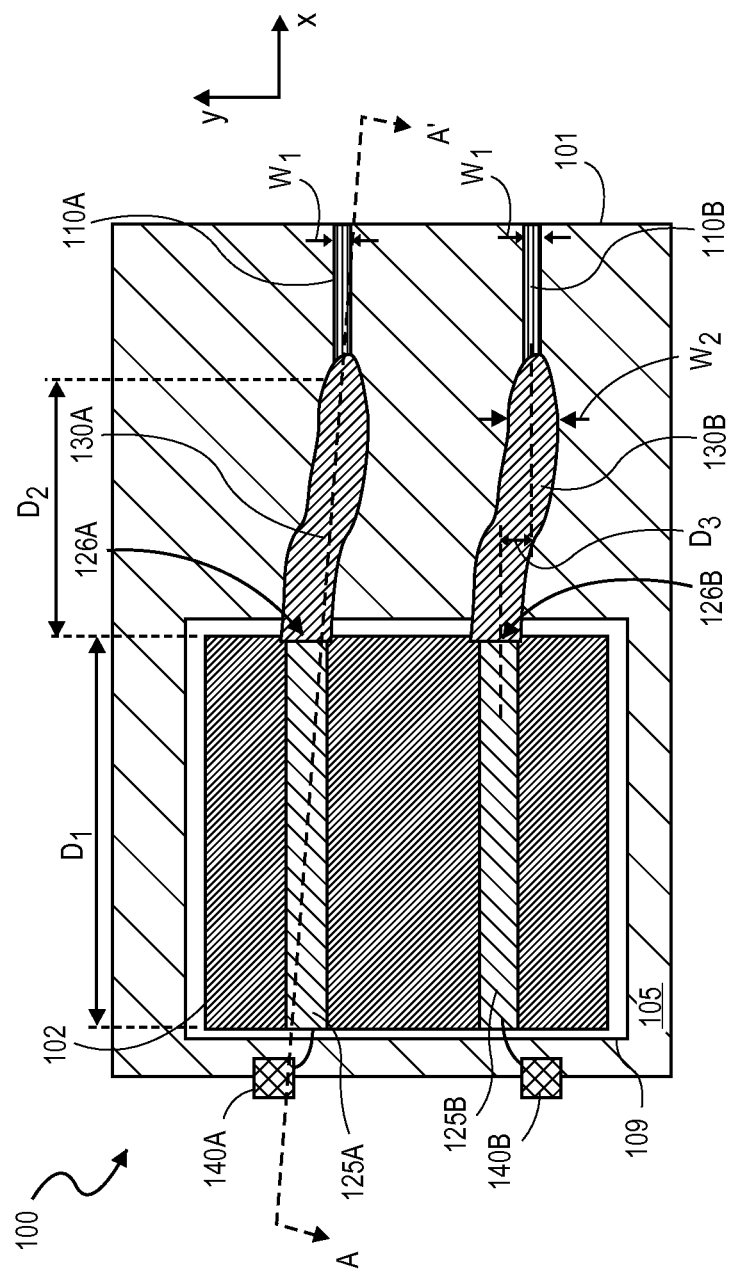
FIG. 1 illustrates a plan view of a PLC including an optical component disposed over a first region of a substrate, a planar optical waveguide disposed over a second region of the substrate, and a polymer optical coupling waveguide disposed over a third region of the substrate, in accordance with an embodiment of the invention.

In the following description, numerous details are set forth, however, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment," or "in one embodiment" means that a particular feature, structure, function, or characteristic described in connection with the embodiment is included in at least one embodiment of the invention. Thus, the appearances of the phrase "in an embodiment" in various places throughout this specification are not necessarily referring to the same embodiment of the invention, or only one embodiment. Furthermore, the particular features, structures, functions, or characteristics may be combined in any suitable manner in one or more embodiments. For example, a first embodiment may be combined with a second embodiment anywhere the two embodiments are not specifically denoted as being mutually exclusive.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" my be used to indicated that two or more elements are in either direct or indirect (with other intervening elements between them) physical or electrical contact with each other, and/or that the two or more elements co-operate or interact with each other (e.g., as in a cause and effect relationship).

As used in the description of the invention and the appended claims, the singular forms "a", "an" and "the" are intended to include the plural forms as well, unless the context clearly indicates otherwise. The term "and/or" as used herein refers to and encompasses any and all possible combinations of one or more of the associated listed items.

The terms "over," "under," "between," and "on" as used herein refer to a relative position of one component or material layer with respect to other components or layers where such physical relationships are noteworthy. For example in the context of material layers, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similar distinctions are to be made in the context of component assemblies.

Generally, embodiments herein utilize a polymer coupling waveguide to optically couple an optical component affixed to a substrate to another optical component or structure affixed or fabricated in another location of the substrate. In embodiments, a polymer coupling waveguide optically couples a planar waveguide disposed over a first region of a substrate to an optical component, such as a laser, affixed to a second region of the substrate. The polymer coupling waveguide may be formed from a polymer layer applied over the substrate features (e.g., a planar waveguide) and the optical component such that any misalignment there between may be accommodated by patterning the polymer into a waveguide having a first end aligned to the substrate features (e.g., an end of the planar waveguide) and a second end aligned to the optical component (e.g., an edge facet of an edge-emitting laser). The optical component may therefore be edge-coupled and yet affixed with much lower alignment accuracy than would be required to directly align the optical component to the planar waveguide.

In embodiments, the polymer employed for the coupling waveguide is photo-definable, for example, having the properties of a negative photoresist. The polymer may then be patterned into the waveguide through direct laser writing, for example. In embodiments, the optical component is disposed on a semiconductor thin film, such as an epitaxial layer or stack, and referred to herein as a "coupon." Such coupons may be of a minimum dimension and thickness to accommodate the optical function of the component, thereby reducing consumption of an expensive material, such as a III-V semiconductor substrate. The coupon is affixed to the substrate through micro-transfer printing and the polymer waveguide formed after the micro-transfer to account for misalignment in the transfer process. In other embodiments, the optical component is a semiconductor chip, or die, and is affixed to the substrate through flip-chip bonding. Depending on the thickness of the optical component affixed to the substrate, a z-thickness of the planarized polymer may be etched back, for example prior to being patterned into the optical coupling waveguide, so as to provide a coupling waveguide having three dimensions of appropriate scale for a single-mode of propagation. For either of these embodiments, the substrate may be a semiconductor wafer onto which host optical and electrical circuitry has already been fabricated, but not yet singulated into chip. For example, a plurality of central processing units, or CPUs, may be fabricated at the wafer-level to each include a planar lightwave circuit, the microtransfer of the optical component is then performed, and then polymer waveguide delinieated.

FIG. 1 illustrates a plan view of a PLC 100 including an optical component 102 disposed over a first region of a substrate 101, a planar optical waveguide 110A disposed over a second region of the PLC substrate 101, and a polymer optical coupling waveguide 130A disposed over a third region of the PLC substrate 101, in accordance with an embodiment of the invention. Generally, the PLC substrate 101 may be any substrate conventional in the art, such as, but not limited to a crystalline group IV semiconductor or alloy thereof. In one exemplary embodiment, the PLC substrate 101 is a substantially single crystalline silicon substrate (i.e., a silicon wafer) and may further be a silicon-on-insulator (SOI) substrate. In other embodiments, the substrate may be polycrystalline, or even amorphous (e.g., glass). While the PLC substrate 101 includes at least the planar optical waveguide 110A, the substrate 101 may further include electrical circuitry, such as logic circuitry. For example, the PLC substrate 101 may include a plurality of fabricated CPU circuits and the planar waveguide 110A communicatively couples into the logic circuitry, for example through the planar waveguide 110A.

The planar waveguide 110A extends laterally within a plane substantially parallel to a top surface of the PLC substrate 101, for example within the xy plane illustrate in FIG. 1. The planar waveguide 110A may take a number of forms, such as, but not limited to, a rib waveguide, ridge waveguide, etc., and in the exemplary embodiment is dimensioned to provide for single-mode propagation of light in the infrared band (e.g., 1290 nm, 1310 nm, etc.). The planar waveguide 110A may include one or more material layers disposed over, or more specifically, directly on the PLC substrate 101. The composition of planar waveguide materials may be dependent on the composition of the PLC substrate 101. For example, in advantageous embodiments where the PLC substrate 101 is silicon, the planar waveguide 110A includes one or more material layers containing silicon. In one such embodiment, the planar waveguide 110A is waveguide entailing a patterned dielectric (e.g., $Si_3N_4$) disposed over a dielectric layer 105 (e.g., $SiO_2$) that is disposed directly on a top surface of a silicon PLC substrate 101. Depending on the implementation, the dielectric layer 105 may be patterned or another material, such as metal, patterned to define structural features of the planar waveguide 110A and/or of other devices. For such a dielectric material system, the planar waveguide 110A may have a lateral width $W_1$ that is less than 1 µm (e.g., 0.3-1 µm), with a comparable z-dimension thickness to provide for single-mode propagation within the infrared band. As another example, for an SOI substrate, the planar waveguide 110A may be a waveguide entailing a patterned silicon layer and/or silicon oxide layer disposed over a top surface of bulk silicon.

The optical component 102 may any passive or active (electro) optical component, with exemplary electro-optical components including a laser 125A emitting with the infrared band (edge-coupled laser depicted in FIG. 1), an EAM, or P-i-N photodiode (photodetector or light emitting diode). In advantageous embodiments, the optical component 102 includes one or more materials non-native to the PLC substrate 101. In other words the optical component is not monolithically integrated onto the PLC substrate 101 (e.g., by heteroepitaxy), but rather is transferred and/or affixed to the PLC substrate 101. Notably, in highly advantageous embodiments, the optical component is fully fabricated, or very nearly so, when transferred and/or affixed to the PLC substrate 101. For example, in FIG. 1 where the optical component includes the emitting laser 125A, prior to affixing the laser 125A to the PLC substrate 101 contact metallization (e.g., p-metal) is deposited and patterned over a suitable III-V semiconductor stack disposed on a III-V substrate). This allows the optical component 102 to be fabricated concurrently with a number of other substantially identical optical components on another substrate (e.g., the III-V substrate), and also enables the affixing of only those optical components to be "known good" through prior testing.

In further embodiments, the optical component 102 includes one or more edge-coupled optical elements. For example, in the context of the laser 125A, emission occurs at an edge facet/surface 126A of the optical component that is non-parallel to the plane of the planar waveguide (e.g., perpendicular to the xy plane depicted in FIG. 1). The edge facet 126A is further illustrated in FIG. 2A, which is a cross-sectional view along the A-A' plane denoted in dashed line in FIG. 1. Depending on the optical component, and further depending on the technique employed to transfer and/or affix the optical component 102 to the PLC substrate 101, the optical component 102 may have a widely varying lateral dimension $D_1$ extending between the edge facet 126A and an opposite edge. For the exemplary embodiment depicted in FIG. 1, $D_1$ is the length of the laser 125A as defined by the edge facet 126A and an opposite edge which may function as a second mirror facet of the laser 125A a grating surface (e.g., as in a distributed feedback laser) or not, (e.g., as in a double sided emitting laser). In certain such embodiments, $D_1$ is on the order of a few hundred microns (e.g., 250-300 μm). In other embodiments, the optical component 102 may have a lateral dimension $D_1$ that is 1-2 orders of magnitude larger than the active device (e.g., mm on a side). Similarly, the thickness (z-dimension) of the optical component 102 may vary widely as a function of the technique employed to transfer and/or affix the component 102 to the PLC substrate 101. FIGS. 2A, 2B further illustrate embodiments where the optical component 102 comprises only a thin film of material with a z-thickness on the order of a few tens of microns, or less, while FIGS. 3A and 3B further illustrate embodiments where the optical component 102 comprises a thick film of material with a z-thickness many tens to a hundred microns, or more.

In embodiments, the optical component 102 is directly bonded to a bulk of the PLC substrate 101. In the exemplary embodiment depicted in FIG. 1 where the PLC substrate 101 includes a bulk silicon semiconductor, the optical component 102 is disposed within a recess 109 where the dielectric layer 105 has been removed to expose the bulk semiconductor in a first region that is slightly larger than the lateral dimensions of the optical component (e.g., $D_1$). This direct bond is advantageous where the optical component 102 generates an appreciable amount of heat. For the exemplary embodiment where the optical component 102 includes the laser 125A, heat generated during operation of the laser may be dissipated to the PLC substrate 101 at higher rate in the absence of one or more intervening dielectric thin films.

Referring still to FIG. 1, the emitting edge surface of the laser 125A is misaligned from ends of the planar waveguide 110A. More particularly, the emitting edge surface of the laser 125A is spaced apart from a first end of the planar waveguide 110A by a distance $D_2$ in the x-dimension. In the y-dimension, as is illustrated for a second laser 125B, which is monolithically integrated with the laser 125A a part of the same optical component 102, emitting laser edge surfaces 126A, 126B are misaligned from the first end of respective planar waveguides 110A, 110B by a distance $D_3$. Misalignment in the z-dimension may be expected as well depending on the component bonding process, as is further illustrated the embodiment shown in FIG. 3A. Generally, the smaller lateral distance $D_3$ is a function of the lateral alignment accuracy with which the optical component 102 is affixed to substrate 102. While this alignment accuracy is a function of the transfer technique employed and can be expected to improve as the state of the art advances, any misalignment nonetheless corresponds to an amount of signal attenuation between the optical component 102 (e.g., laser 125A) and the features formed on the PLC substrate 101 (e.g., the planar waveguide 110A). In exemplary embodiments, $D_3$ is more than 1 μm, may be 2-5 μm, or more. The spacing $D_2$ is a function of both the misalignment of the optical component 102 and patterning of the planar waveguide(s), with the planar waveguide patterning positioning an end of the planar waveguide so as to accommodate a length of a coupling waveguide in the first (x) dimension sufficient to accommodate the misalignment in the second (y) dimension equal to $D_3$. In exemplary embodiments, the spacing $D_2$ is 10-100 μm, or more.

In embodiments, the coupling waveguide 130A disposed between the planar waveguide 110A and the optical component 102 functions to optically couple, and therefore integrate, the waveguide 110A and optical component 102 into the PLC 100. As shown in FIGS. 1 and 2A, the coupling waveguide 130A spans at least the distance $D_2$ over the PLC substrate 101 in the x-dimension and spans at least the distance $D_3$ in the y-dimension. The coupling waveguide 130A therefore accounts for misregistration of the optical component 102, improving optical coupling efficiency between the planar waveguides 110A, 110B and respective emitting lasers 125A, 125B.

In embodiments, the coupling waveguide 130A is polymer. Certain polymer compositions are advantageous both for their optical properties as well as for the ability to apply such a material with a spin-on process that can planarize over the optical component 102. Advantageous optical properties include an index of refraction that provides a sufficient index match with the planar waveguide 110A and edge facet 126A to provide good optical coupling and sufficient index contrast to surrounding materials over the length of the coupling waveguide 130A to maintain a single-mode of propagation within a lateral width $W_2$ of 4-5 μm, for example. Advantageous optical properties further include photosensitivity. In certain embodiments, the polymer employed for the coupling waveguide 130A is photo-definable, and may be therefore further classified as a photo resist. The photo resist may be either positive or negative tone. In particular embodiments, the polymer is of a composition that functions as a negative photo resist with the coupling waveguide 130A being exposed and cured portions of the polymer applied and un-exposed polymer removed from the PLC substrate 101. With photosensitive polymer formulations, a direct laser writing of the coupling waveguide 130A becomes possible, as described further elsewhere herein. Examples of such a polymer include, but are not limited to the SU-8 series, commercially available from Microchem, of USA, and the WPR series commercially available from JSR, of Japan.

Notably, as shown in FIG. 2A, the polymer coupling waveguide 130A spans the recess gap $G_R$ between the optical component edge facet 126A and an edge of the recess 109. With adequate dimensioning of the recess 109 relative to the amount of optical component misalignment and z-thickness of the dielectric layer 105, the polymer may be applied so as to fill the recess gap $G_R$ for a continuous waveguide between the edge facet 126A and the end portion of the planar waveguide 110A. The coupling waveguide 130A may have a top surface 135 approximately planar with a top surface 155 of the optical component (e.g., laser 125A) where the emissive end facet 126A spans the entire thickness $T_1$, or nearly so, as is depicted in FIG. 2A. For example, where the optical component (e.g., laser 125A) has a z-thickness $T_1$ that is significantly less than the minimum lateral dimension $D_1$, advantageously less than 20 μm, more advantageously less than 10 μm, and most advantageously 4-8 μm, the polymer coupling waveguide 130A has approximately the same thickness as the optical component 102 (i.e., with 10%). Such planarization between the coupling waveguide 130A and laser 125A may result from spin-on application of the polymer, for example. Lateral patterning of the coupling waveguide 130A defines both the coupling waveguide width $W_2$, and the waveguide length spanning at least $D_2$. The coupling waveguide may further be patterned to extend over an end portion 106 of the planar waveguide 110A, as a function of desired coupling architecture and/or desired coupling efficiency. Coupling waveguides may further include adiabatic tapers, etc. as known in art.

In embodiments, contact metallization disposed on the optical component 102 is electrically connected to metallization on the PLC substrate 101 with one or more interconnect level. As shown in FIGS. 1 and 2A, contact pads 140A, 140B are coupled to metallization (e.g., p-metal and n-metal) disposed on the top side 155 of the optical component 102 by interconnect metallization 150A. Because the z-thickness $T_1$ is so small in the embodiment illustrated in FIG. 2A (e.g., 6 μm), the interconnect metallization 150A may be either Cu interconnects embedded in a dielectric material 170, as depicted in FIG. 2B, or in the form of an air bridge of the type, for example, that may be found in RF ICs, and as depicted in FIG. 2A. Alternatively, interconnects 150A, 150B may be in the form of wire bonds. For the embodiment illustrated in FIG. 2B, which includes all the features of the PLC 100 depicted in FIGS. 1 and 2A aside from the interconnect implementation and dielectric material 170, each of the planar waveguide 110A, laser 125A and polymer coupling waveguide 130A is encapsulated in the dielectric material 170. The dielectric material 170 may be for example, any build-up material, such as spin-on glass, SU-8, polyimide, or other polymer conventional to controlled collapse (i.e., C4), or similar backend processes.

Figure 2C:
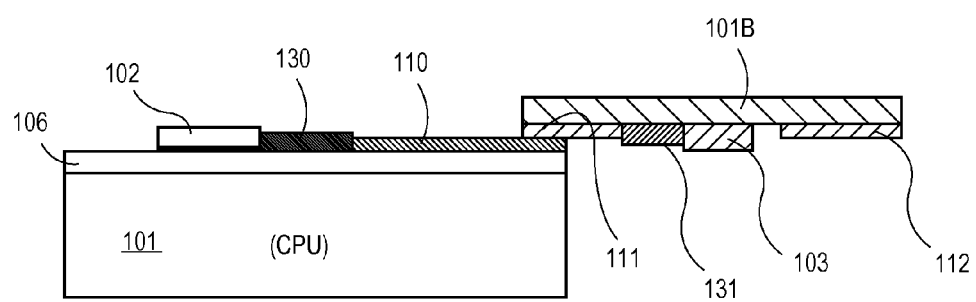
FIG. 2C illustrates a cross-sectional view of the PLC in FIG. 1, where the substrate is a CPU chip, in accordance with an embodiment.

FIG. 2C illustrates a cross-sectional view of the PLC in FIG. 1 for a specific embodiment where the substrate 101 comprises a CPU. As shown, the optical component 102 (e.g., modulator or photo detector) is coupled to the planar waveguide 110 by the polymer coupling waveguide 130. The planar waveguide 110, for example, is disposed on, or embedded in, a backend inter-layer dielectric 106 of the fabricate CPU microcircuitry. The optical component 102 be may further embedded within an opening made in a thick metallization layer (not depicted). Optionally, as is depicted in FIG. 2C, a second optical component 103, such as a laser, is disposed on another substrate 101B. The substrate 101B further includes a planar waveguide 111, and is therefore another PLC substrate. The planar waveguide 111 may be, for example, an evanescent coupling waveguide, optically coupled to the optical component 103 by a second polymer coupling waveguide 131. A third planar waveguide 112 may further incorporate any waveguide-to-fiber coupler known in the art. The substrate 101B may be, for example, sodered to the CPU substrate 101 prior to die attaching the CPU chip to a package substrate. In an alternative embodiment, the substrate 101B may be sufficiently large so as to further function as an interposer to which the CPU chip is mounted and then with a polymer coupling waveguide utilized to optically couple the CPU substrate 101 directly to the substrate 101B. For such an embodiment, the CPU substrate 101 is advantageously thinned to 150 μm, or less. For these embodiments, very high speed operaiton in excess of 50 Gbps is possible without electrical traces, or I/O bumps. Furthermore, capacitance associated with ESD protection circuitry may also be eliminated.

Figure 3A:
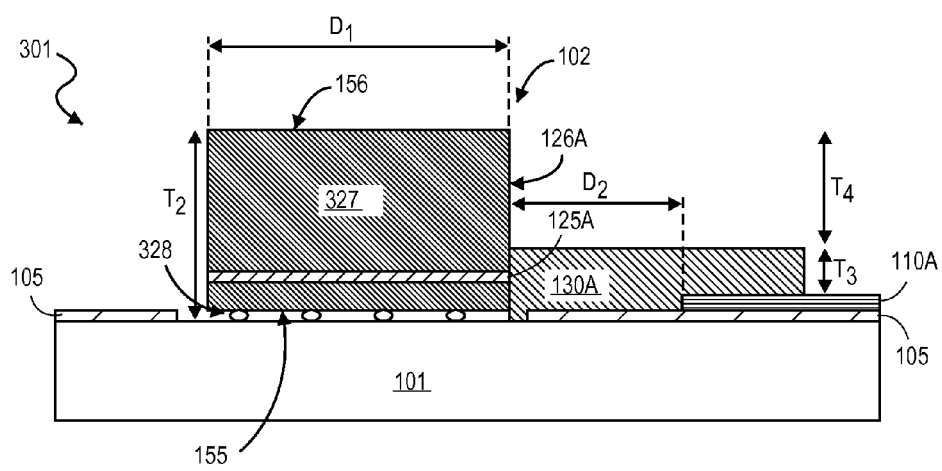
FIG. 3A illustrates a cross-sectional view of the PLC in FIG. 1, where the optical component includes a semiconductor die flip-chip bonded onto a top surface of the substrate, in accordance with an embodiment.

FIG. 3A illustrates a cross-sectional view of another PLC embodiment represented in the plan view by FIG. 1, but for the device 301 the optical component 102 includes a semiconductor die flip-chip bonded onto a top surface of the PLC substrate 101. For such an embodiment, the optical component z-thickness is $T_2$, which is significantly greater than was the z-thickness $T_1$ illustrated in FIG. 2A. More specifically, the z-thickness $T_2$ includes both a thickness of a III-V semiconductor stack associated with the laser 125A, and also a thickness of a supporting substrate 327 (e.g., III-V bulk). As such, $T_2$ may be 100-300 μm, or more. For this embodiment of the PLC 100, interconnects between the laser 125A and the PLC substrate 101 are provided by (micro)bumps 328 joining a first surface 155 to an opposing top surface of the PLC substrate 101. In this inverted position, an emitting surface of the laser 125A is only a portion of the z-thickness $T_2$ and the polymer coupling waveguide 130A abutting the edge facet 126 has a z-thickness $T_3$ that is significantly less than $T_2$. The z-thickness $T_3$ is generally a function of the proximity of the emitting stack to the surface 155, and the joint z-height corresponding to the (micro)bumps 328. In exemplary embodiments, the edge surface 126 comprises an emissive region within 10 μm of the top surface of the PLC substrate 101, and the polymer coupling waveguide 130A has a planar top surface that is recessed from the surface 156 of the optical component 102 by an amount $T_4$ that ensures both single-mode propagation and adequate edge-coupling efficiency between the coupling waveguide 130A and the laser 125A.

Figure 3B:
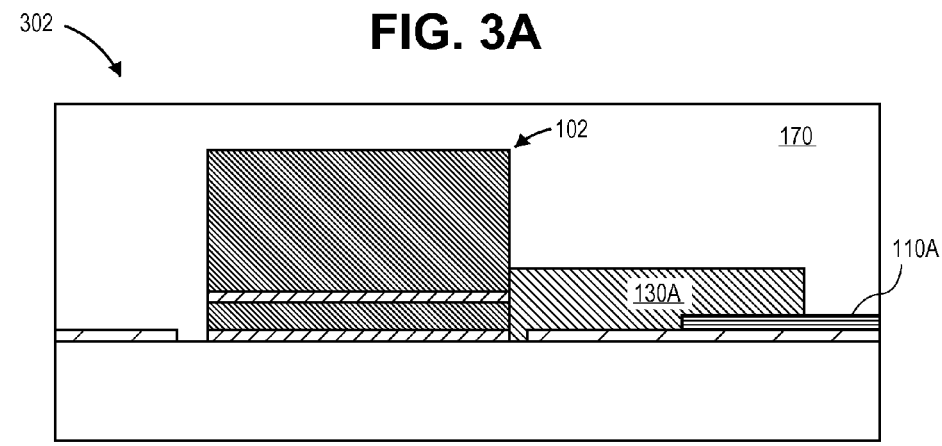
FIG. 3B illustrates a cross-sectional view of the PLC in FIG. 1, where the optical component includes a semiconductor die flip-chip bonded onto a top surface of the substrate, in accordance with an embodiment.

FIG. 3B illustrates a cross-sectional view of another PLC embodiment that is represented in the plan view by FIG. 1, but for the device 302, the optical component includes a semiconductor die flip-chip bonded onto a top surface of the substrate, in accordance with an embodiment compatible with the embodiment depicted in FIG. 3A. For the device 302, the dielectric material 170 encapsulates each of the optical components 102, planar waveguide 110A, and polymer coupling waveguide 130A. Alternatively the dielectric material 170 may only clad the waveguides 130A and 110A. Any of the materials previously described for the dielectric material 170 (e.g., spin-on glass, SU-8, PI, etc.) may be applied in this embodiment as well.

Figure 4:
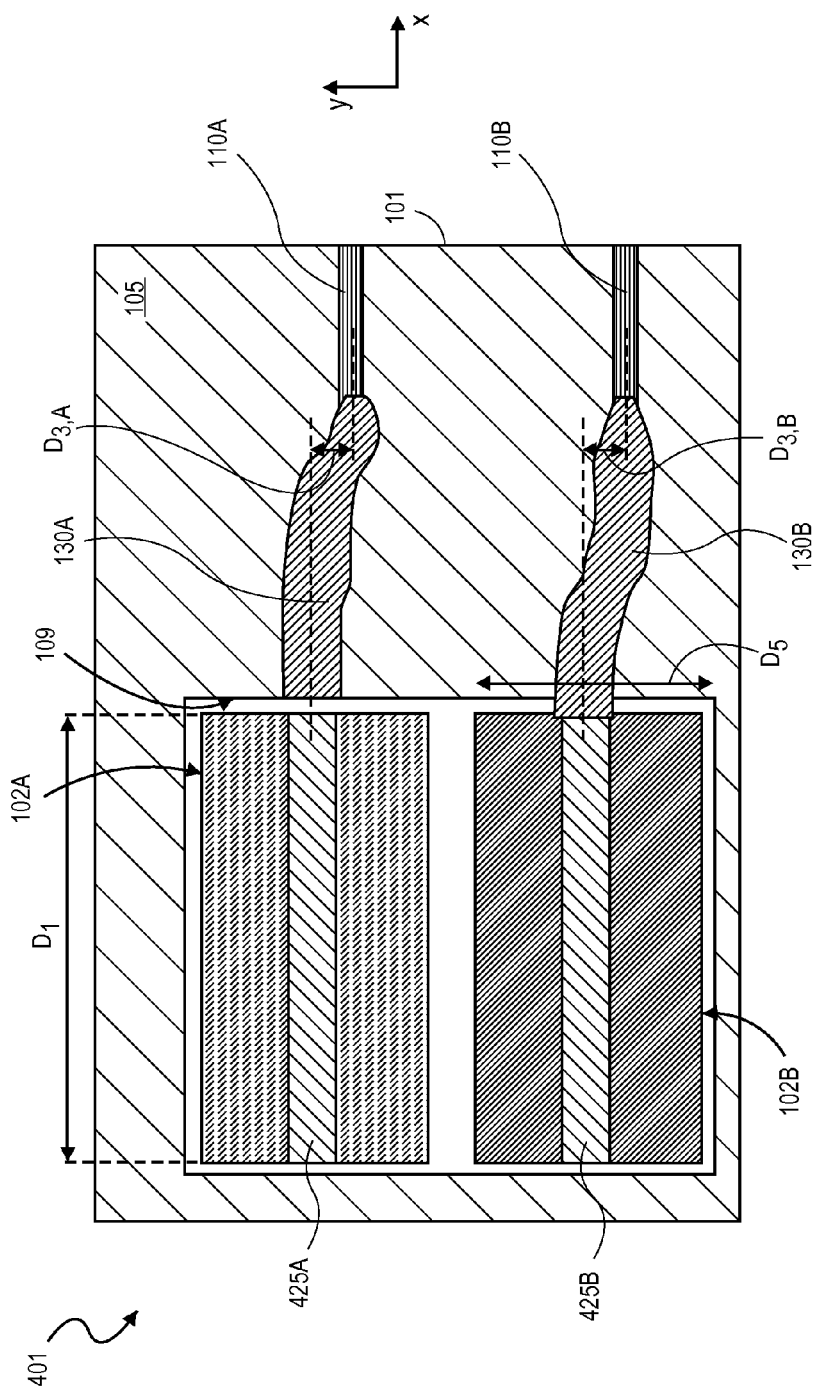
FIG. 4 illustrates a plan view of a PLC including a plurality of optical components disposed over a first region of a substrate, a plurality of planar optical waveguides disposed over a second region of a substrate, and a plurality of polymer optical waveguides disposed over a third region of the substrate, in accordance with an embodiment of the invention.

FIG. 4 illustrates a plan view of a PLC 401 including a plurality of optical components 102A and 102B disposed over a first region of the PLC substrate 101, a plurality of planar optical waveguides 110A, 110B disposed over a second region of the PLC substrate 101, and a plurality of polymer optical waveguides 130A, 130B disposed over a third region of the PLC substrate 101, in accordance with an embodiment of the invention. As shown, each of the optical components 102A, 102B include an edge-emitting laser 425A, 425B, respectively. In further embodiments, each of the optical components 102A, 102B may include a plurality of monolithically integrated lasers, for example as was illustrated for the optical component 102 in FIG. 1. In the exemplary embodiment, the laser 425A emits at a first wavelength (i.e., has a first band of emission), such as 1290 nm, while the laser 425B emits at a second wavelength (i.e., has a second band of emission), such as 1310 nm. In this manner, optical devices first fabricated on two separate substrates (e.g., having two different III-V epitaxial stacks on two different III-V wafers) may be integrated on to the same substrate 101, for example in a wavelength division multiplexing (WDM) application. The optical components 102A, 102B need not have similar lateral dimensions $D_1$ and $D_5$, and are disposed within the recess opening 109 in direct contact with the substrate bulk (e.g., silicon). Both of the optical components 102A, 102B may then either be in the thin film form that was illustrated in FIG. 2A, or are in the thick film, flip-chip form illustrated in FIG. 3A.

With each of the optical components 102A, 102B separately transferred and/or affixed to the PLC substrate 101, each is independently associated with some lateral misregistration or misalignment to the planar waveguides 110A, 110B patterned on the PLC substrate 101. For example, the laser 425A is misaligned in the y-dimension by an amount $D_{3,A}$ from a center of the planar waveguide 110A while the laser 425B is misaligned in the y-dimension by an amount $D_{3,B}$ from a center of the planar waveguide 110B.

In the PLC 401, the polymer coupling waveguide 130A accommodates a first misalignment between with optical component 102A and the planar waveguide 110A by having a first end aligned with the emitting end facet of the laser 425A and a second end aligned with an end of the planar waveguide 110A. Likewise, the polymer coupling waveguide 130B accommodates a second misalignment between with optical component 102B and the planar waveguide 110B by having a first end aligned with the emitting end facet of the laser 425B and a second end aligned with an end of the planar waveguide 110B. For certain advantageous embodiments where the polymer coupling waveguides 130A and 130B are independently patterned, for example by direct laser writing as described elsewhere herein, the polymer waveguide patterning process may accommodate different amounts of misalignment between distinct components and the PLC substrate 101.

Figure 5:
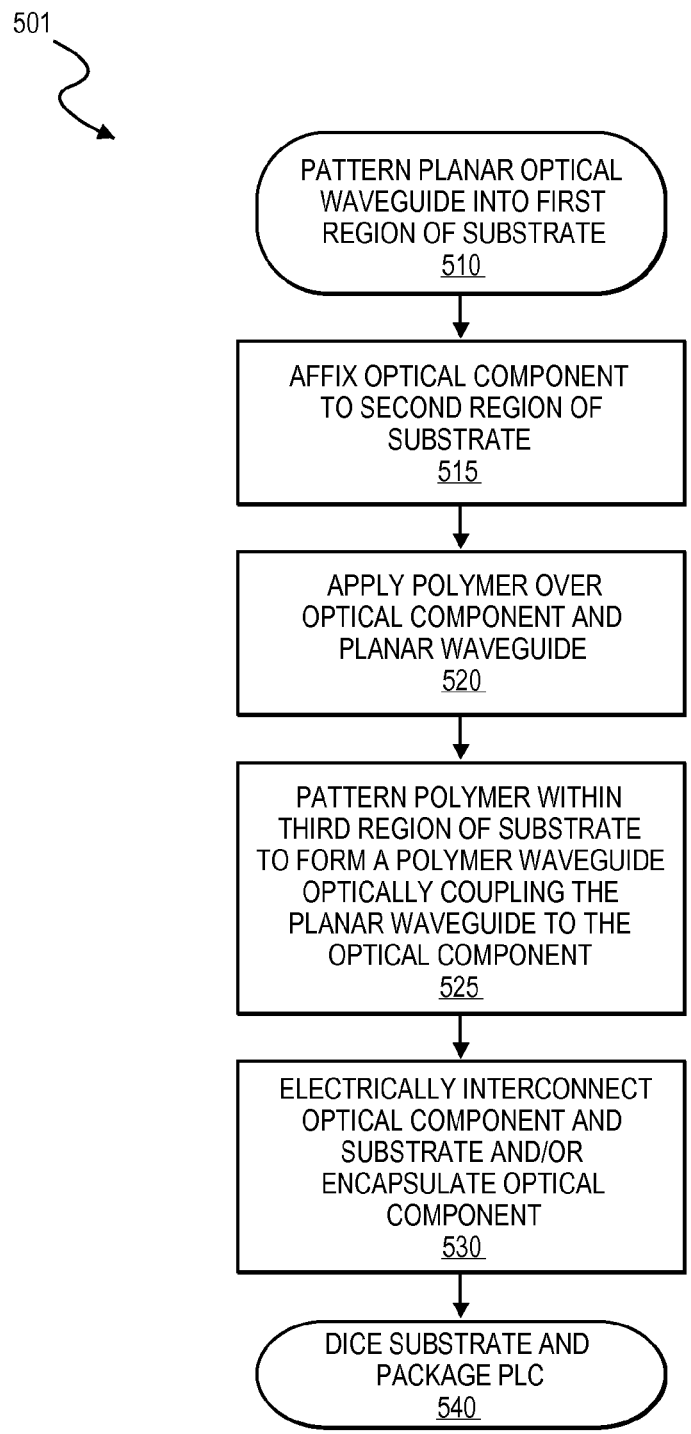
FIG. 5 is a flow diagram illustrating a method of forming a polymer coupling waveguide to integrate a planar waveguide disposed on a PLC substrate with an optical component non-native to the substrate to form a planar lightwave circuit (PLC), in accordance with an embodiment.

FIG. 5 is a flow diagram illustrating a method 501 of forming a polymer waveguide to integrate a planar waveguide disposed on a PLC substrate with an optical component to form a planar lightwave circuit (PLC), in accordance with an embodiment. Generally, the method 501 entails forming the polymer waveguide after the planar waveguide and optical component are fabricated and affixed on the substrate so as to account for misregistration between the two. As previously noted, suitable substrates include a glass substrate, a silicon on insulator, or a silicon wafer with fabricated electronic circuitry, such as, but not limited to a CPU.

The method 501 begins with patterning of a planar optical waveguide into a first region of a substrate at operation 510. Any conventional techniques, such as, but not limited to, photolithography and anisotropic etching (plasma, crystallographic, etc.), may be employed to form the planar waveguides by patterning one or more materials disposed over the substrate before affixing an optical component to the substrate. Prior to affixing the optical component to the substrate, any conventional fabrication process may be employed. For example, in one exemplary embodiment, a photoresist pattern is formed over a $Si_3N_4$ layer disposed on a $SiO_2$ layer, and the pattern transferred into the $Si_3N_4$ layer by an etch that stops on the $SiO_2$ layer.

Figure 6A:
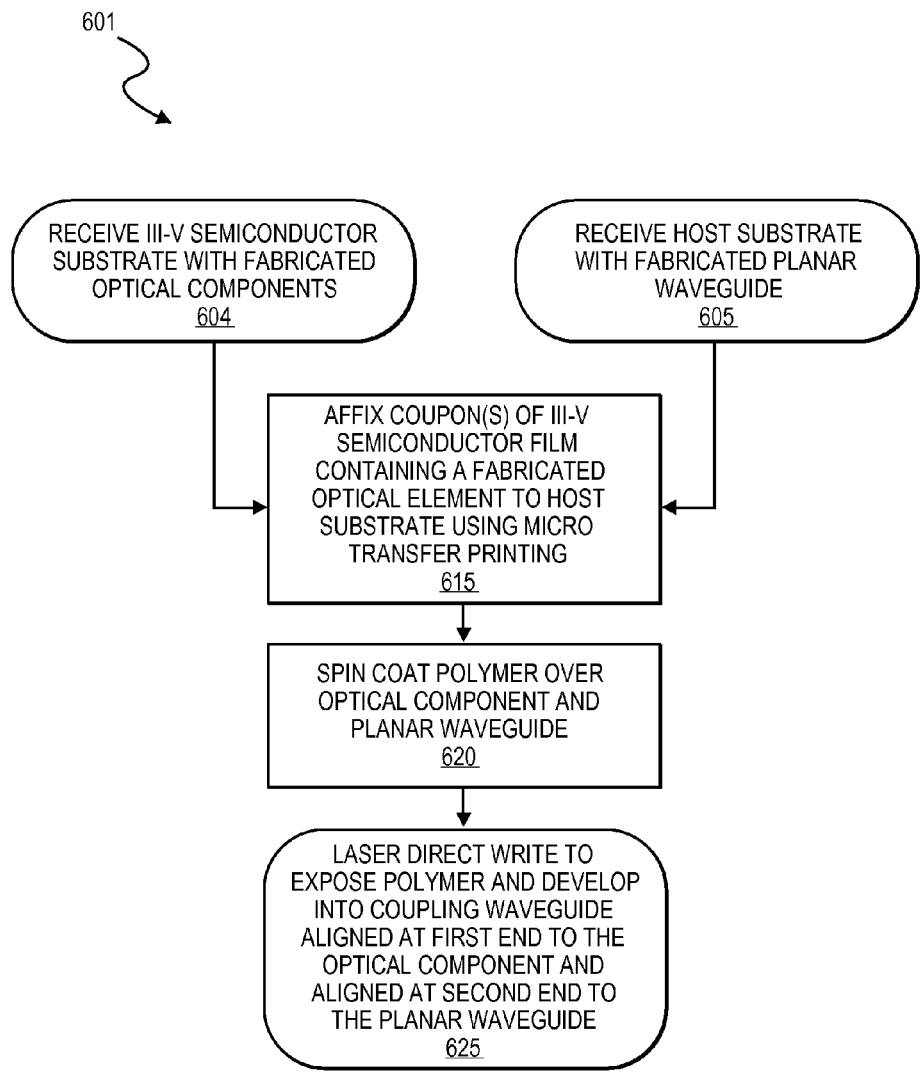
FIG. 6A is a flow diagram illustrating a method employing micro-transfer printing of an optical component onto the substrate employed in the method depicted in FIG. 5, in accordance with an embodiment.
Figure 6B:
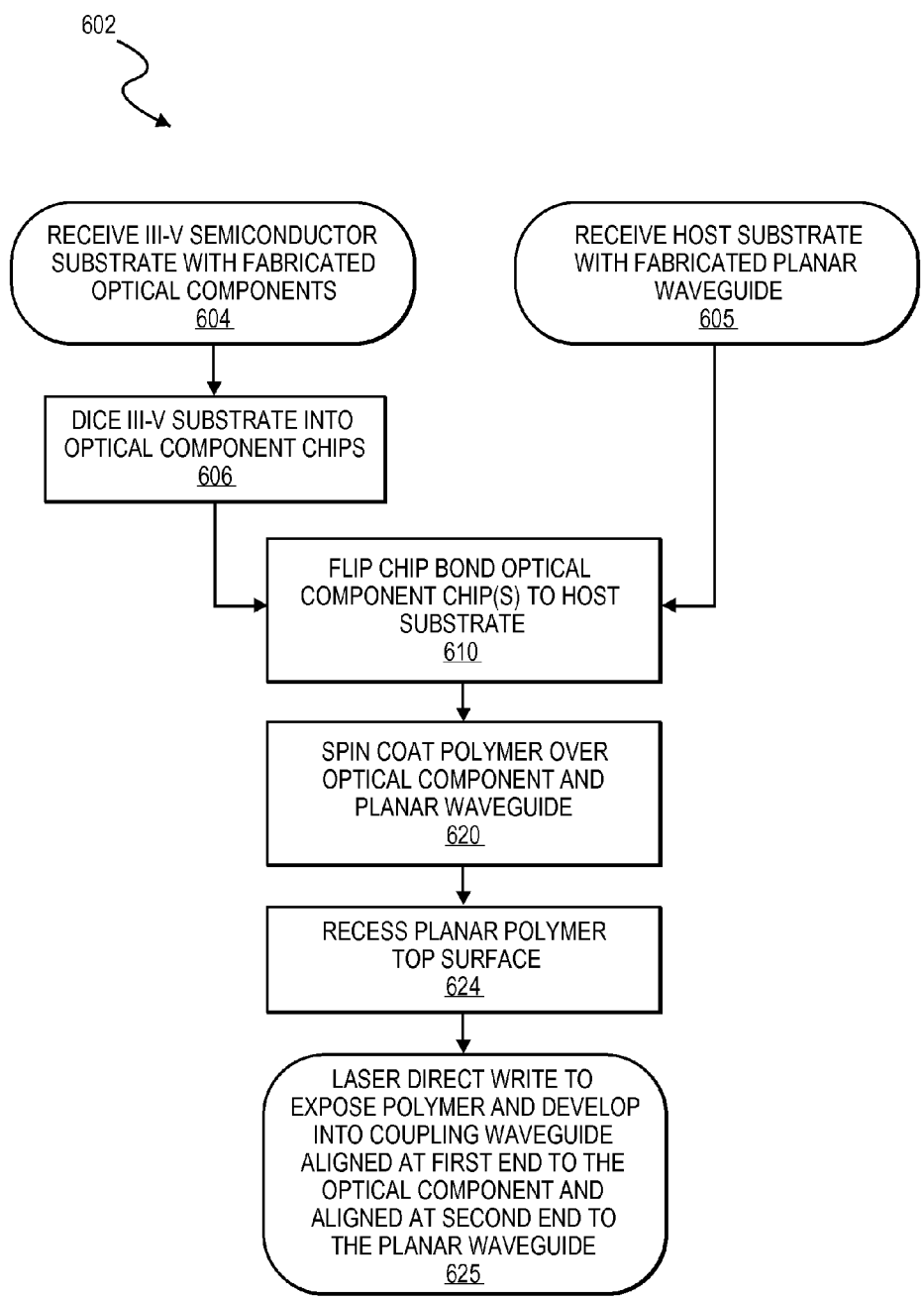
FIG. 6B is a flow diagram illustrating a method employing flip-chip bonding of an optical component onto the substrate employed in the method depicted in FIG. 5, in accordance with an embodiment.

At operation 515, one or more optical component is affixed to a second region of the substrate. Generally, because the method 501 utilizes a polymer waveguide to accommodate misregistration between the substrate and the optical component being bonded, there is wide latitude in performing operation 515 as the placement accuracy requirements are relaxed. FIGS. 6A and 6B further illustrate two advantageous bonding methods, and are described further elsewhere herein. Once the optical component is affixed to the PLC substrate, one or more polymer is applied over both the optical component and the planar optical waveguide at operation 520. At operation 525, the polymer is then patterned within a third region of the substrate to form a polymer waveguide structure that optically couples the planar waveguide to the optical component.

At operation 530, the optical component is, electrically connected to the PLC substrate with interconnect metallization and a polymer overcoat applied to encapsulate the optical component, planar waveguide, and interconnects. The PLC substrate is then diced into PLC chip and each chip then packaged using any conventional technique at operation 540. In advantageous embodiments where the topography of the optical component is not significant (e.g., <20 μm) a backend interconnect process is employed to form the interconnect metallization. For example, one or more dielectrics (e.g., polymers such as PI) may be applied (e.g., spun-on) over the optical component and polymer waveguide, via holes/routing lines etched into the dielectric, and metal (e.g., Cu) plated into the via holes/routing lines. In embodiments where optical component topography is significant (e.g., >100 μm), interconnect metallization is in the form of interconnect bumps formed during the flip-chip bonding process. The final polymer overcoat may similarly be PI, SU-8, etc. and applied with a spin-on process or other liquid dispensing technique conventional in the art.

FIG. 6A is a flow diagram illustrating a method 601 employing micro-transfer printing of the optical component, in accordance with a first embodiment, and FIG. 6B is a flow diagram illustrating a method employing flip-chip bonding of the optical component, in accordance with a second embodiment. Method 601 is generally suitable for affixing optical components disposed on thin films such as epitaxial layers with thicknesses of a few tens of microns (e.g., <50 μm), for example to form the structures described in FIG. 2A. The method 602 is generally suitable for affixing optical components disposed on bulk materials, such as III-V semiconductor substrates with thicknesses of many tens to hundreds of microns), for example to form the structures described in FIG. 3A.

Referring first to FIG. 6A, the method 601 begins at operation 604 with receipt of a first substrate, such as a III-V semiconductor substrate with optical components (e.g., edge-emitting lasers, edge-emitting diodes, edge-coupling photodetectors, edge-coupling EAM, etc.) fabricated thereon. Such optical components may be fabricated with any techniques conventional in the art. A second (PLC) substrate, such as a silicon semiconductor substrate, with at least one planar waveguide fabricated thereon, and possibly with other electrical devices such as metal lines and/or logic transistors (e.g., as would be found in a CPU), is received at operation 605. Notably, throughout the method 601 the PLC substrate remains in full-wafer form and is not diced until after method 601 is completed (e.g., at the packaging operation 540 in FIG. 5). In further embodiments, a recess may be etched into a region of the PLC substrate that is to receive the optical component. For example, as illustrated in FIGS. 1 and 2A, the recess 109 may be etched 2-5 µm into the dielectric layer 105 disposed over bulk semiconductor of the PLC substrate (e.g., 101) to expose a top surface of the bulk semiconductor. In one specific embodiment, the operation 510 (FIG. 5) is performed to arrive at the PLC substrate of operation 605.

Continuing with FIG. 6A at operation 615, a thin film coupon of III-V semiconductor containing the fabricated optical element is affixed to the PLC substrate using microtransfer printing. Micro-transfer printing is generally a technique whereby a well-controlled undercut etch of the optical component leaves a thin epitaxial semiconductor layer coupon physically coupled to the III-V semiconductor substrate by only a few anchor points. For example, an epitaxial stack may include a material layer that may be etched with high selectivity to the others and that material layer almost completely removed within the area of the coupon. A top surface of the weakly anchored coupon is then contacted with a stamper, which pulls the coupon off by severing the anchor points, for example through mechanical action. The stamper then brings a bottom surface of the coupon in contact with the PLC substrate, and where the bonding forces (e.g., electrostatic and/or van der Waals, etc.) between the coupon's III-V semiconductor surface and the PLC substrate surface (e.g., silicon) exceed the attractive forces between the stamper and the coupon, the coupon is transferred/bonded to the PLC substrate. The micro-transfer technique has been experimentally verified for the transfer of epitaxial layers 1 µm thick for coupons with lateral dimensions as small as 10 µm×150 µm and was found to have a placement accuracy of +/−2 µm. In particular embodiments where the optical component is any of an edge emitting laser, edge coupled photodetector, edge emitting diode, or edge-coupled EAM, the micro-transfer process may entail transferring an epitaxial stack less than 10 µm, and more advantageously less than 6 µm.

Method 601 then proceeds to operation 620 where a polymer, such as but not limited to SU-8 series or WPR series, is spin-coated over the optical component and planar waveguide. Any conventional spin coat process may be utilized as the presence of the thin (e.g., 4-8 µm) epitaxial transferred coupons pose small enough topography, particularly where a recess is first etched into the area of the substrate that is to receive the transfer coupon. Polymer of less than 10 µm in z-thickness may be applied, for example, to overcome the topography associated with the optical component and planarize a top surface of the coupling waveguide approximately with a top surface of the optical component.

Following polymer application, the polymer is patterned. In one embodiment of the exemplary method 601 where the polymer is photo-definable (e.g., SU-8 or WPR), the polymer is patterned with a direct-writing tool, many of which are commercially available. Direct writing proceeds by directly exposing selected regions of the polymer to an emission (e.g., laser, electron-beam, etc.) to pattern one end of the polymer coupling waveguide aligned a surface of the optical component (e.g., emitting edge surface for edge-emitting laser embodiments) and pattern an opposite end aligned to the planar waveguide. In advantageous embodiments where the polymer is a negative resist, the direct write tool exposes only the portion of the polymer where the waveguide is to be formed (e.g., only a few tens to a 100 µm scan distance) and the remainder of the polymer is removed with a conventional develop process. Following the develop process, the polymer waveguide is cured through conventional means. The method 501 (FIG. 5) may then be completed, for example to form electrical interconnects between the optical component and the substrate and/or encapsulating the entire PLC.

Referring next to FIG. 6B, the method 602 also begins with receipt of a first substrate, such as a III-V semiconductor substrate with optical components (e.g., edge-emitting lasers, edge-emitting diodes, edge-coupling photodetectors, edge-coupling EAM, etc.) fabricated thereon at operation 604. A PLC substrate with fabricated planar waveguides and possibly with other electrical devices such as metal lines and/or logic transistors (e.g., as would be found in a CPU) is also received at operation 605. As with the method 601, throughout the PLC substrate remains in full-wafer form and is not diced until after method 602 is completed (e.g., at the packaging operation 540 in FIG. 5).

Figure 7A:
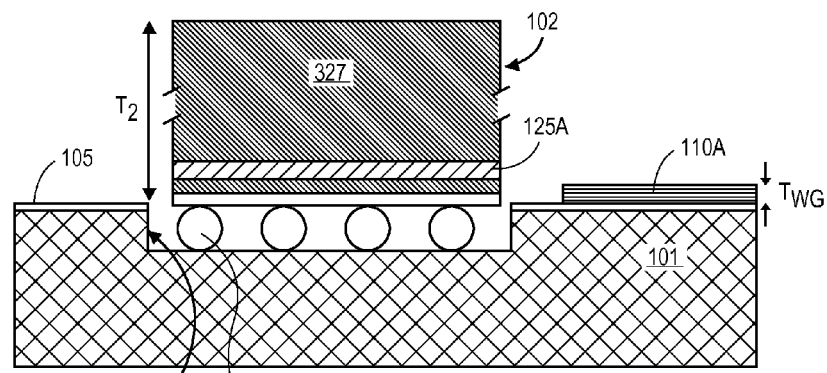
FIGS. 7A-7D are cross-sectional views of an electronic device following certain operations as the method illustrated in FIG. 6B is performed, in accordance with an embodiment.

At operation 606, the substrate with the optical components is diced into a plurality of separate optical component die or chips. In advantageous embodiments, the dicing process provides good optical interfaces and precise dimensioning either through cleave, laser scribe, plasma or wet etch, or a combination thereof. At operation 610, an optical component die is flip-chip bonded to a region of the PLC substrate proximate to the planar waveguide(s), but not coincident to the planar waveguide(s). Any conventional flip-chip bonding process may be employed at operation 610. FIGS. 7A-7D are cross-sectional views of an electronic device following certain operations as the method 602 is performed, in accordance with an embodiment. FIG. 7A illustrates the optical component 102 flip-chip bonded onto a surface of the PLC substrate 101. The region of the PLC substrate 101 occupied by the interconnect bumps 328 may be recessed 702, as shown in FIG. 7A, or not.

Figure 7B:
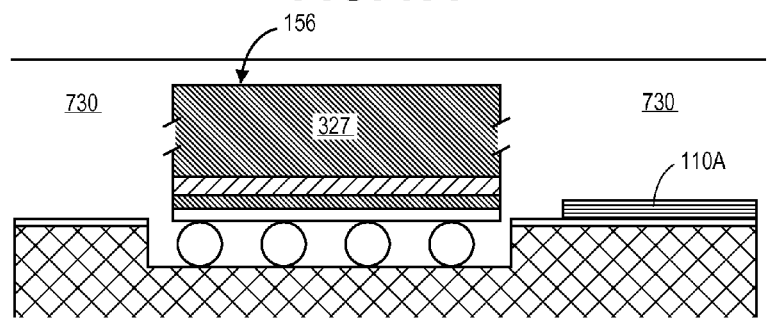
Figure 7C:
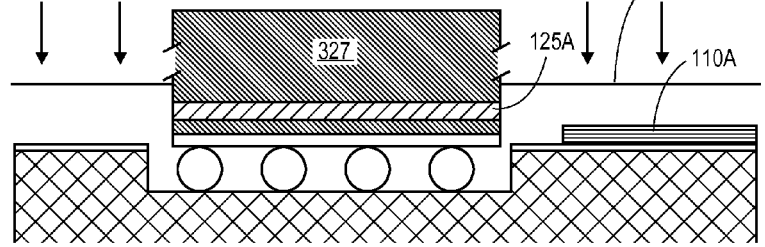
Figure 7D:
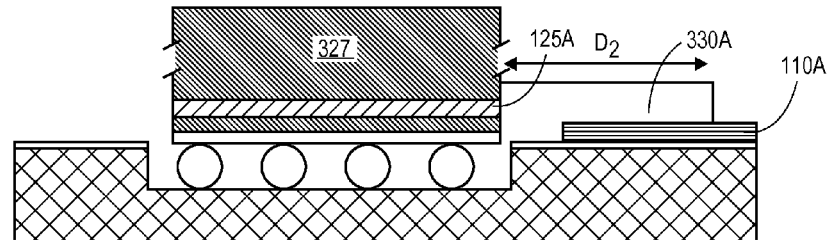

At operation 620 polymer is applied, for example by spin coating, over the optical component die and planar waveguide. Referring to FIG. 7B, because the z-thickness of the optical component die is significant (e.g., $T_2$ is 100 µm, or more), the polymer film 730 is thickly applied to planarize the polymer top surface over the optical component surface 156. At such a thickness, multi-mode propagation within a coupling waveguide made from the polymer might be difficult to avoid for any polymer composition, and therefore in an advantageous single-mode embodiment, a top portion of the polymer z-thickness is removed at operation 624. As further depicted in FIG. 7B, the planar top polymer surface 736 is thereby recessed below the optical component die surface 156, and toward a top surface of the planar waveguide 110A. Thinning of the polymer may be performed, for example, with a timed exposure to a developer of SU-8, or JSR, where the polymer is SU-8 or JSR. The develop process can retain the substantially planar top surface 736 as the polymer thickness is reduced from the spin-on thickness to near the z-height of the optical interface (e.g., emitting edge of laser 125A).

Returning to FIG. 6B, the method 602 is completed at operation 625, with the remaining thickness of the polymer laterally patterned into an optical waveguide, for example with a laser direct writing tool, to align a first end to the optical component (edge) and to align a second end to the planar waveguide. Following the exposure, a develop process is performed to remove all portions of the polymer not exposed by the laser direct writing tool in advantageous negative resist embodiments (e.g., SU-8, WPR, etc.), to form the polymer coupling waveguide 330A, as is further depicted in FIG. 7D. Following the develop process, the polymer waveguide is cured through conventional means. For this embodiment, the bonding materials should be capable of withstanding the high temperature polymer curing (typically in the range of 200-250 C). For example, a Au/Sn soldering process in the range of 250-350 C would be acceptable.

Figure 8:
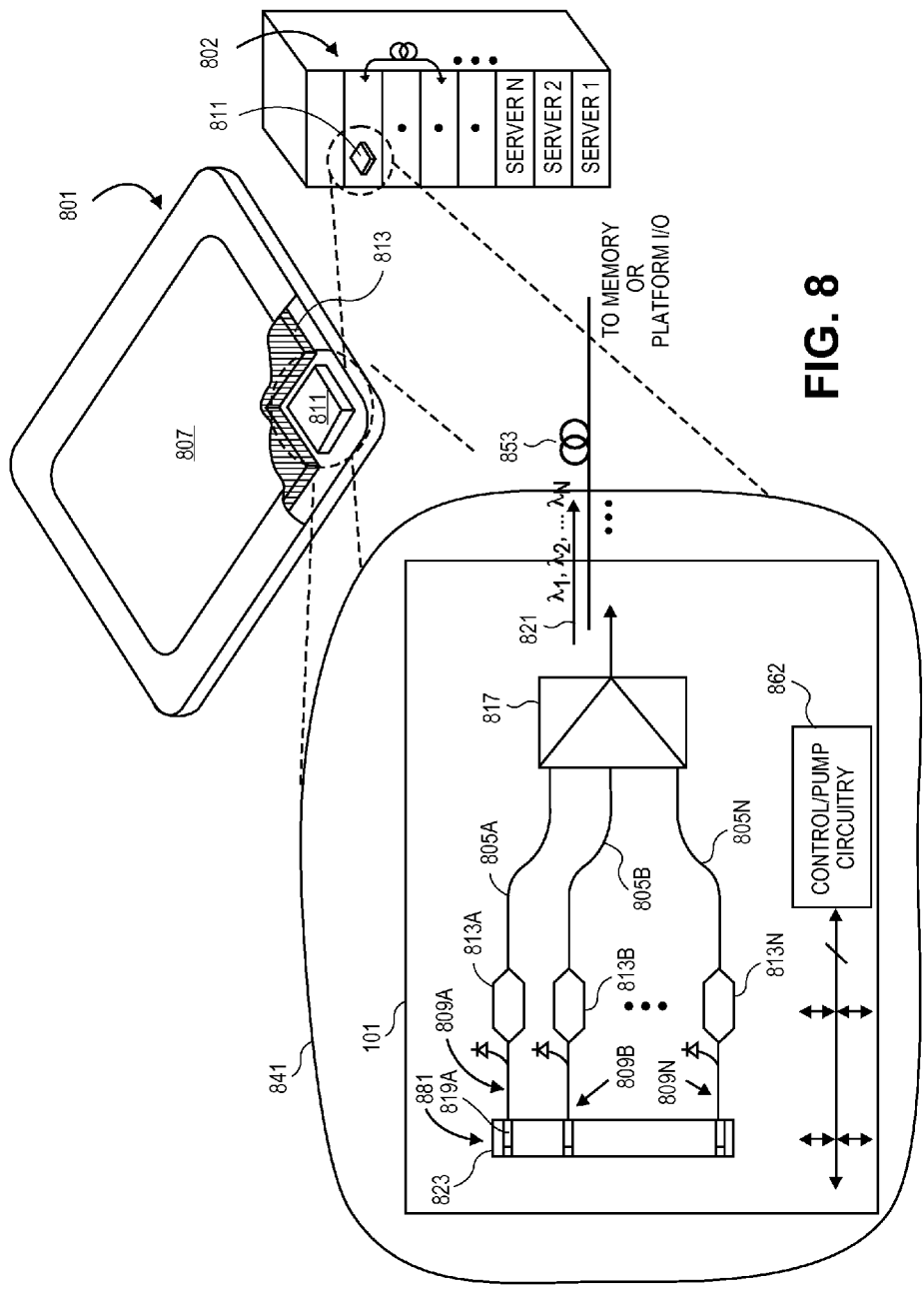
FIG. 8 illustrates electronic devices including a processor, a memory, and an optical transmitter further comprising a PLC coupled to at least one of the processor and memory, in accordance with embodiments.

FIG. 8 illustrates electronic devices that include a processor, a memory, and an optical transmitter further comprising a PLC coupled to at least one of the processor and memory, in accordance with embodiments. In the illustrated embodiments, the optical transmitter module 811 is a component in either a consumer electronic device, such as the mobile computing platform 801, or in a data server machine 802. Generally, the mobile computing platform 801 may be any portable device configured for each of electronic data display, electronic data processing, and wireless electronic data transmission. For example, the mobile computing platform 801 may be any of a laptop, a netbook, a notebook, an ultrabook, a tablet, a smart phone, etc. and includes a display screen 807, which may be a touchscreen (e.g., capacitive, resistive, etc.) the optical receiver module 811, and a battery 813. The sever machine 802 may be any data processing platform, such as those employed in commercial data centers throughout the world.

The transmitter module 811 is further illustrated in the expanded functional block view 841. The optical wire 853 receives a single optical beam 821, which is optically coupled into the planar waveguides 805A, 805B, 805N, for example by top side coupling or edge coupling disposed on the PLC substrate 101. Selected wavelengths are combined with an optical multiplexer 817. The plurality of optical waveguides 805A-805N are each further optically coupled to EAM 813A, 813B, 813N, respectively, which are in turn electrically coupled to downstream integrated circuitry disposed on the PLC substrate 101. In embodiments, the EAM 813A, 813B, 813N are optical components affixed to the PLC substrate 101 as described elsewhere herein in the context of FIG. 1 with a polymer coupling waveguide (not depicted in FIG. 8) optically coupling the EAM 813A, 813B, 813N to the corresponding planar waveguide 805A, 805B, 805N. As further depicted in FIG. 8, upstream of the EAM are lasers (e.g., edge emitting) monolithically integrated into a second optical component 881 including a III-V semiconductor substrate 823 affixed to the PLC substrate 101, for example as described elsewhere herein in the context of FIG. 1. Alternatively, each laser (e.g., 819A) may be a distinct optical component separately affixed to the PLC substrate 101. The lasers disposed on the optical component 881 are optically coupled into the planar waveguide with a polymer coupling waveguide, substantially as described elsewhere herein. The laser(s) disposed on the optical component 881 is(are) further electrically interconnected to the control/pump circuitry 862 by way of solder bumps or interconnect metallization, as described elsewhere herein. Notably, in the specific embodiment depicted in FIG. 8, polymer waveguides 809A, 809B, 809N are employed to optically couple the optical component 881 directly the optical components 813A, 813B, 813N, respectively. As such, FIG. 8 illustrates how a planar waveguide need not be disposed between two serially arranged optical components within the PLC on the PLC substrate 101.

Figure 9:
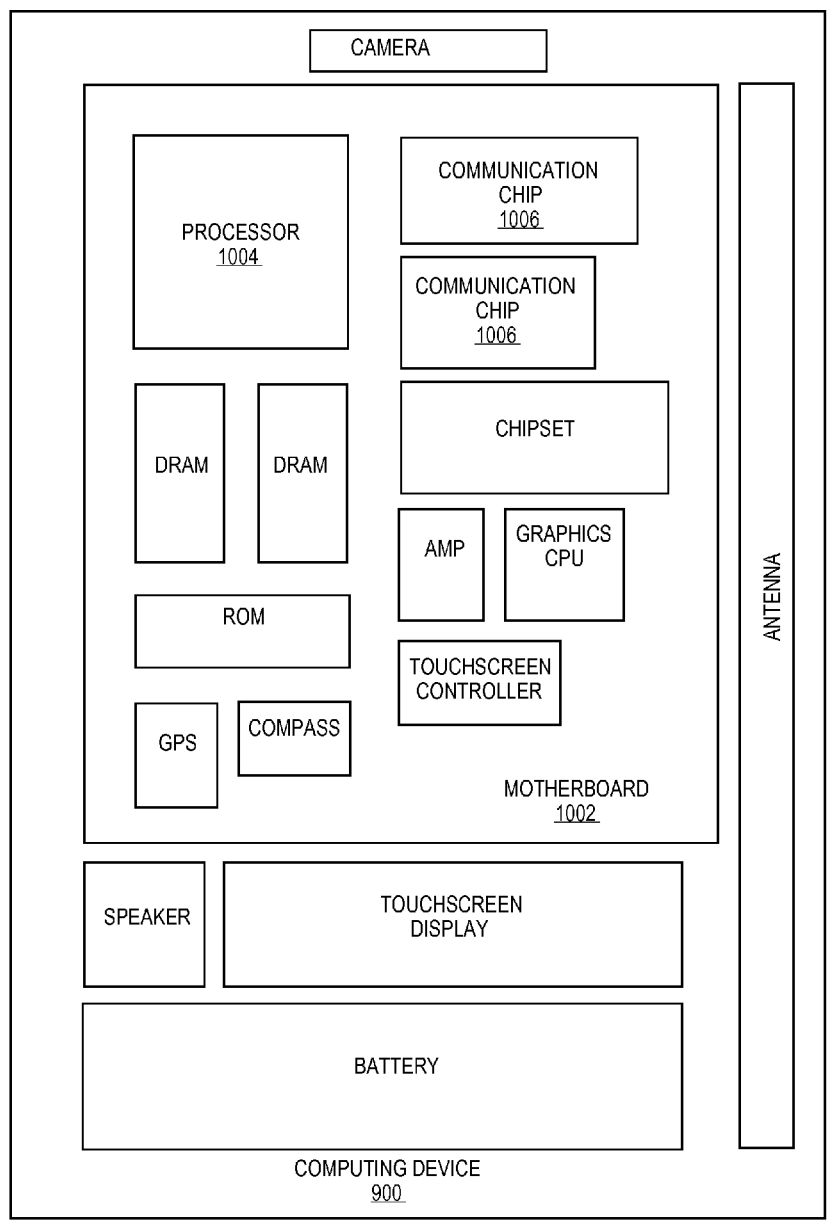
FIG. 9 is a functional block diagram of an electronic device depicted in FIG. 8, in accordance with an embodiment.

FIG. 9 is a functional block diagram of a computing device 900 in accordance with certain embodiments of the invention. The computing device 900 may be disposed in the mobile computing platform 801 or server machine 802 and may further include a number of components, including but not limited to a processor 1004 (e.g., an applications processor) and at least one communication chip 1006. The processor 1004 is physically and electrically coupled to a board 1002. In some implementations the at least one communication chip 1006 is also physically and electrically coupled to the board 1002. In further implementations, the communication chip 1006 is part of the processor 1004. Depending on its applications, mobile computing device 900 may include other components on the board 1002. These other components include, but are not limited to, volatile memory (e.g., DRAM), non-volatile memory (e.g., ROM), flash memory, a graphics processor, a digital signal processor, a crypto processor, a chipset, an antenna, touchscreen display, touchscreen controller, battery, audio codec, video codec, power amplifier, global positioning system (GPS) device, compass, accelerometer, gyroscope, speaker, camera, and mass storage device (such as hard disk drive, solid state drive (SSD), compact disk (CD), digital versatile disk (DVD), and so forth).

At least one of the communication chips 1006 enables wireless communications for the transfer of data to and from the mobile computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 900 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 includes an integrated circuit die packaged within the processor 1004. The term "processor" may refer to any device or portion of a device that processes electronic data from registers and/or memory to transform that electronic data into other electronic data that may be stored in registers and/or memory. In embodiments, one or more of the communications chip 1006 or processor 1004 is coupled to another of the communications chip 1006 or processor 1004 through a PLC in conformance with one or more embodiments described elsewhere herein. Of course, any other integrated circuit chips employing optical waveguides and bonded optical components may similarly incorporate a polymer coupling waveguide in conformance with one or more embodiments described elsewhere herein.

It is to be understood that the above description is intended to be illustrative, and not restrictive. For example, while flow diagrams in the figures show a particular order of operations performed by certain embodiments of the invention, it should be understood that such order is not necessarily required (e.g., alternative embodiments may perform the operations in a different order, combine certain operations, overlap certain operations, etc.). Furthermore, many other embodiments will be apparent to those of skill in the art upon reading and understanding the above description.

Exemplary embodiments include a planar lightwave circuit (PLC), including an optical component affixed to a first region of a substrate, a planar optical waveguide extending laterally in a plane over a second region of the substrate, and a polymer optical coupling waveguide disposed over a third region of the substrate, wherein a first end of the coupling waveguide is optically coupled to a surface of the optical component, and a second end of the coupling waveguide is optically coupled an end of the planar waveguide.

In further embodiments, the first waveguide is composed of a different material than the coupling waveguide and is a single-mode waveguide having a cross-sectional width less than 5 µm.

In further embodiments, the optical component comprises a semiconductor film non-native to the substrate and affixed to the substrate.

In further embodiments, the optical component surface is an edge surface non-parallel to the plane of the planar waveguide.

In further embodiments, the coupling waveguide has dimensions that maintain the single mode propagated by the planar waveguide.

In further embodiments, the first end of the coupling waveguide is physically aligned to the edge surface of the component, and the second end of the polymer waveguide is physically aligned to an end portion of the planar waveguide and wherein the end portion of the planar waveguide and the edge surface are not physically aligned to each other.

In further embodiments, the first end of the planar waveguide is disposed more than 1 µm from the surface of optical component.

In further embodiments, the optical component comprises at least one edge emitting laser or incorporating a III-V semiconductor film, or at least one edge-coupled electro-absorption modulator (EAM) incorporating a III-V semiconductor film, or at least one edge-coupled photodetector or emitting diode incorporating a III-V semiconductor film.

In further embodiments, the semiconductor film has a thickness that is less than 10 µm.

In further embodiments, there is a metallization interconnecting a contact disposed on a top side of the semiconductor film, and a bottom side of the semiconductor film is in direct contact with the substrate.

In further embodiments, the substrate is silicon, and the semiconductor film is disposed within a recess formed in a dielectric layer that is disposed under the coupling waveguide within the third region, and the coupling waveguide spans the recess between the dielectric layer and the edge surface.

In further embodiments, the optical component comprises a die flip-chip bonded onto a top surface of the substrate with electrical interconnects formed on a surface of the die proximate to the substrate, and the semiconductor film has a thickness over 50 µm and wherein the edge surface comprises an epitaxial layer of the die disposed within 10 µm of the top surface of the substrate.

In further embodiments, the optical component comprises of plurality of edge emitting lasers incorporating a contiguous III-V semiconductor film, or a plurality of edge-coupled electro-absorption modulators (EAM) incorporating a contiguous III-V semiconductor film, or a plurality of edge-coupled photodetectors or emitting diodes incorporating a contiguous III-V semiconductor film;

In further embodiments, the planar waveguide is one of a plurality of planar waveguides disposed on the substrate, and the coupling waveguide is one of a plurality of coupling waveguides, each coupling waveguide optically coupling one of the planar waveguides to one of the edge emitting lasers, edge-coupled EAM, or edge-coupled photodetectors or emitting diodes.

Another embodiment provides an electronic device, including a processor, a memory, and an optical transmitter communicatively coupled to at least one of the processor and the memory, and the optical transmitter further comprises a planar lightwave circuit (PLC), the PLC including an optical component affixed to a first region of a substrate, a planar optical waveguide extending laterally in a plane over a second region of the substrate, and a polymer optical coupling waveguide disposed over a third region of the substrate with a first end of the coupling waveguide edge-coupled to the optical component, and with a second end of the coupling waveguide optically coupled to an end of the planar waveguide.

In further embodiments, the planar waveguide is of a material other than that of the coupling waveguide and has z-height less than 6 µm, the optical component comprises a semiconductor film non-native to the substrate, the semiconductor film being either less than 10 µm in z-thickness and affixed to the substrate with a semiconductor-semiconductor bond, or over 50 µm in z-thickness and affixed to the substrate with electrical interconnects disposed under the semiconductor film and over the substrate.

In further embodiments, a top of the edge-coupled surface is less than 10 µm above a bottom of the first waveguide, and the coupling waveguide has a z-thickness no more than 10 µm and a substantially planar top surface.

In further embodiments, the coupling waveguide has a z-thickness at least equal to that of the semiconductor film with the top surface of the coupling waveguide below, or substantially planar with, a top surface of the optical component.

In further embodiments, there is a polymer overcoat encapsulating the optical component, the coupling waveguide, and the planar waveguide.

Another embodiment includes a method of integrating a planar waveguide on a PLC substrate with an optical component affixed to the PLC substrate to form a planar lightwave circuit (PLC) where the method includes applying a polymer over the planar waveguide extending laterally in a plane over a first region of the substrate and over the optical component, and over the optical component affixed to a second region of the substrate spaced apart from the first region, and then patterning the polymer over a third region of the substrate into a coupling waveguide extending laterally between the first and second regions and to optical couple an edge of the optical component to the planar waveguide.

In further embodiments, patterning the polymer comprises a direct writing of the polymer and removal of the un-exposed polymer.

In further embodiments, the planar waveguide is patterned by etching one or more materials disposed over the substrate before affixing the optical component to the substrate.

In further embodiments, the method further comprises affixing the optical component by micro-transfer printing the non-native semiconductor film onto the substrate, or wherein the method further comprises affixing the optical component by flip-chip bonding the optical component to the substrate with electrical interconnects.

In further embodiments, affixing the optical component further comprises micro-transfer printing the semiconductor film onto the substrate, and applying the polymer over the optical component and planar waveguide further comprises spin coating the polymer to planarize a top surface of the coupling waveguide with a top surface of the optical component.

In further embodiments, applying the polymer over the optical component and first waveguide further comprises spin coating the polymer to planarize a top surface of the polymer over a top surface of the optical component, and removing a top portion of the polymer z-thickness to recess the planar top surface of the polymer toward a top surface of the planar waveguide.

In further embodiments, the optical component comprises at least one edge emitting laser incorporating a III-V semiconductor film, or at least one edge-coupled electro-absorption modulator (EAM) incorporating a III-V semiconductor film, or at least one edge-coupled photodetector or emitting diode incorporating a III-V, wherein the substrate is silicon, and wherein the planar waveguide comprises a silicon-containing dielectric material. In further embodiments, the method includes encapsulating the optical component, the planar waveguide, and coupling waveguide in a polymer overcoat.

Although the present invention has been described with reference to specific exemplary embodiments, it will be recognized that the invention is not limited to the embodiments described, but can be practiced with modification and alteration within the spirit and scope of the appended claims. The scope of the invention should, therefore, be determined with reference to the appended claims, along with the full scope of equivalents to which such claims are entitled.

What is claimed is:

1. A planar lightwave circuit (PLC), comprising:
an optical component that generates light affixed to a first region of a substrate;
a planar optical waveguide extending laterally in a plane over a second region of the substrate; and
a polymer optical coupling waveguide disposed over a third region of the substrate, wherein a first end of the polymer optical coupling waveguide is optically coupled to a surface of the optical component, and a second end of the polymer optical coupling waveguide is optically coupled to an end of the planar optical waveguide, wherein the polymer optical coupling waveguide does not extend over the optical component and is in contact with the optical component and the polymer optical coupling waveguide is sandwiched between the optical component and the planar optical waveguide, wherein the polymer optical coupling overlaps an upper surface of the planar optical waveguide, wherein the optical component, the polymer optical coupling waveguide and the planar optical waveguide are arranged along a same horizontal plane such that the light generated by the optical component propagates in a substantially same direction from the optical component through the polymer optical coupling waveguide and into the planar optical waveguide, wherein the planar optical waveguide is composed of a different material than the polymer optical coupling waveguide and is a single-mode waveguide having a cross-sectional width less than 5μm wherein the optical component surface comprises an edge surface that is non-parallel to the plane of the planar waveguide wherein the first end of the polymer optical coupling waveguide is physically aligned to the edge surface of the component. wherein the second end of the polymer waveguide is physically aligned to an end portion of the planar waveguide and wherein the end portion of the planar waveguide and the edge surface are not physically aligned to each other.

2. The PLC of claim 1, wherein the polymer optical coupling waveguide has dimensions that maintain the single mode propagated by the planar optical waveguide.

3. The PLC of claim 1, wherein the first end of the planar optical waveguide is disposed more than 1 μm from the surface of optical component.

4. The PLC of claim 1, wherein the optical component comprises at least one of:
an edge emitting laser incorporating a III-V semiconductor film;
an edge-coupled electro-absorption modulator (EAM) incorporating a III-V semiconductor film
an edge-coupled photodetector;
an emitting diode incorporating a III-V semiconductor film.

5. The PLC of claim 4, wherein the III-V semiconductor film has a thickness that is less than 10 μm.

6. The PLC of claim 5, further comprising a metallization interconnecting a contact disposed on a top side of the III-V semiconductor film, and wherein a bottom side of the III-V semiconductor film is in direct contact with the substrate.

7. The PLC of claim 6, wherein the substrate comprises silicon, and the III-V semiconductor film is disposed within a recess formed in a dielectric layer that is disposed under the polymer optical coupling waveguide within the third region, and wherein the polymer optical coupling waveguide spans the recess between the dielectric layer andthe edge surface.

8. The PLC of claim 1, wherein the optical component comprises a die flip-chip bonded onto a top surface of the substrate with electrical interconnects formed on a surface of the die proximate to the substrate.

9. The PLC of claim 1, wherein the optical component is comprised of a plurality of light emitting devices incorporating a contiguous III-V semiconductor film.

10. An electronic device, comprising:
a processor;
a memory; and
an optical transmitter communicatively coupled to at least one of the processor and the memory, wherein the optical transmitter further comprises a planar lightwave circuit (PLC), the PLC comprising:
an optical component that generates light affixed to a first region of a substrate;
a planar optical waveguide extending laterally in a plane over a second region of the substrate; and
a polymer optical coupling waveguide disposed over a third region of the substrate, wherein a first end of the polymer optical coupling waveguide is edge- coupled to the optical component, and a second end of the polymer optical coupling waveguide is optically coupled to an end of the planar waveguide, wherein the polymer optical coupling waveguide does not extend over the optical component and is in contact with the optical component and the polymer optical coupling waveguide is sandwiched between the optical component and the planar optical waveguide, wherein the polymer optical coupling overlaps an upper surface of the planar optical waveguide, wherein the optical component, the polymer optical coupling wave guide and the planar optical waveguide are arranged along a same horizontal plane such that light generated by the optical component propagates in a substantially same direction from the optical component through the polymer optical coupling waveguide and into the planar optical waveguide, wherein the planar optical waveguide is composed of a different material than the polymer optical coupling waveguide and is a single- mode waveguide having a cross-sectional width less than 5 µm wherein the optical component surface comprises an edge surface that is non-parallel to the plane of the planar waveguide wherein the first end of the polymer optical coupling waveguide is physically aligned to the edge surface of the component, wherein the second end of the polymer waveguide is physically aligned to an end portion of the planar waveguide and wherein the end portion of the planar waveguide and the edge surface are not physically aligned to each other.

11. The electronic device of claim 10, wherein the planar waveguide is comprised of a material other than that of the polymer optical coupling waveguide and has a z-height less than 6µm, wherein the optical component comprises a semiconductor film non-native to the substrate, the semiconductor film being less than 10µ.m in z- thickness.

12. The electronic device of claim 11, wherein the polymer optical coupling waveguide has a z-thickness of no more than 10µm.

13. The electronic device of claim 12, wherein the polymer optical coupling waveguide has a top surface below, or substantially planar with, a top surface of the optical component.

14. The electronic device of claim 11, further comprising a polymer overcoat encapsulating the optical component, the polymer optical coupling waveguide, and the optical planar waveguide.

* * * * *